(12) United States Patent
Chen et al.

(10) Patent No.: US 9,681,574 B1
(45) Date of Patent: Jun. 13, 2017

(54) CHASSIS SELF-UNLOCK MECHANISM

(71) Applicant: AIC INC., Taoyuan (TW)

(72) Inventors: Yung-Tsung Chen, Taoyuan (TW);
Wei-Shih Wu, Taoyuan (TW);
Siang-An Jhou, Taoyuan (TW)

(73) Assignee: AIC INC., Taoyuan (TW)

( * ) Notice: Subject to any disclaimer, the term of this patent is extended or adjusted under 35 U.S.C. 154(b) by 0 days.

(21) Appl. No.: 15/240,012

(22) Filed: Aug. 18, 2016

(51) Int. Cl.
| | | |
|---|---|---|
| *A47B 88/00* | (2017.01) | |
| *H05K 7/14* | (2006.01) | |
| *H05K 5/02* | (2006.01) | |
| *E05B 65/44* | (2006.01) | |
| *E05B 63/22* | (2006.01) | |

(52) U.S. Cl.
CPC .......... *H05K 7/1489* (2013.01); *E05B 63/22* (2013.01); *E05B 65/44* (2013.01); *H05K 5/023* (2013.01); *H05K 5/0221* (2013.01)

(58) Field of Classification Search
CPC .... H05K 5/0221; H05K 7/1489; H05K 5/023; E05C 3/14; E05B 63/22; E05B 65/44
See application file for complete search history.

(56) References Cited

U.S. PATENT DOCUMENTS

| | | | | |
|---|---|---|---|---|
| 4,955,678 A * | 9/1990 | Kobayashi | ............... | B60R 11/02 312/274 |
| 6,373,695 B1 * | 4/2002 | Cheng | .................... | G06F 1/184 312/223.1 |
| 6,398,041 B1 * | 6/2002 | Abbott | ..................... | H02B 1/36 211/26 |
| 6,654,240 B1 * | 11/2003 | Tseng | ...................... | G06F 1/187 312/332.1 |
| 8,238,118 B2 * | 8/2012 | Li | .......................... | G06F 1/1626 361/727 |
| 8,611,099 B2 * | 12/2013 | Sun | ......................... | H05K 5/023 361/725 |
| 9,211,003 B1 * | 12/2015 | Chen | .................... | H05K 7/1489 |
| 2004/0056572 A1 * | 3/2004 | Chen | ......................... | E05C 3/14 312/333 |

(Continued)

FOREIGN PATENT DOCUMENTS

| | | |
|---|---|---|
| CN | 204728840 U | 10/2015 |
| TW | M281050 U | 11/2005 |

(Continued)

OTHER PUBLICATIONS

Office Action dated Nov. 7, 2016 of the corresponding Taiwan patent application.

*Primary Examiner* — Hanh V Tran
(74) *Attorney, Agent, or Firm* — Chun-Ming Shih; HDLS IPR Services

(57) ABSTRACT

A chassis self-unlock mechanism includes a tray, a handle assembly and a locking arm. The handle assembly includes a fixed base, a handle and a slider connected to the handle. The fixed base is fixed on the tray, and the slider is movably connected with the fixed base. The locking arm is attached to the tray, an end of the locking arm is fixed to the tray, an actuating slope inclined with respect to the locking arm is formed on the locking arm, a latch laterally protrudes from the locking arm, and the latch protrudes out of an outer surface of the tray. The slider is movable to push the actuating slope, so that the locking arm is bent, and the latch retracts into the tray.

8 Claims, 10 Drawing Sheets

(56) References Cited

U.S. PATENT DOCUMENTS

| | | | |
|---|---|---|---|
| 2007/0018547 A1* | 1/2007 | Yang | H05K 7/1489 312/333 |
| 2008/0217497 A1* | 9/2008 | Yang | H05K 7/1489 248/298.1 |
| 2010/0019638 A1* | 1/2010 | Duan | H05K 7/1489 312/334.44 |
| 2010/0226083 A1* | 9/2010 | Wang | H05K 7/1489 361/679.02 |
| 2013/0016930 A1* | 1/2013 | Fan | H05K 7/1489 384/35 |
| 2013/0176690 A1* | 7/2013 | Sun | H05K 7/1489 361/747 |
| 2013/0278124 A1* | 10/2013 | Hu | A47B 96/025 312/333 |
| 2014/0334750 A1* | 11/2014 | Fan | A47B 88/06 384/10 |
| 2016/0205803 A1* | 7/2016 | Zhu | H05K 7/1489 361/679.02 |
| 2016/0262538 A1* | 9/2016 | Chen | H05K 7/1489 |

FOREIGN PATENT DOCUMENTS

| | | |
|---|---|---|
| TW | M298003 U | 9/2006 |
| TW | M345113 U | 11/2008 |
| TW | M531640 U | 11/2016 |

\* cited by examiner

US 9,681,574 B1

CHASSIS SELF-UNLOCK MECHANISM

TECHNICAL FIELD

The present invention relates to a chassis drawer and, in particular, to a chassis self-unlock mechanism.

BACKGROUND

At present, servers are normally placed in a server cabinet or in a drawer of a chassis, so when maintenance is required, the drawer can be pulled out for maintenance operations. In order to prevent the drawer from sliding out of the server cabinet or the chassis, a locking mechanism is usually disposed between the drawer and the server cabinet/chassis, so as to lock the drawer in the server cabinet or in the chassis. During maintenance operations, operators are required to unlock the locking mechanism first, and then the drawer can be pulled out from the server cabinet or the chassis. The drawers receiving hard disks are heavy, so the operators need to use both hands to pull out the drawers; however, it is very inconvenient to pull the drawers while operating the locking mechanism at the same time.

Accordingly, the inventor made various studies to improve the above-mentioned problems, on the basis of which the present invention is accomplished.

SUMMARY

The present invention provides a chassis self-unlock mechanism whereby a drawer is unlocked at the same time when the drawer is pulled out from a server cabinet/chassis.

The present invention provides a chassis self-unlock mechanism, comprising a tray, a handle assembly and a locking arm. The handle assembly includes a fixed base, a handle and a slider connected to the handle. The fixed base is fixed on the tray. The slider is movably connected with the fixed base. The locking arm is attached to the tray, and end of the locking arm is fixed to the tray. An actuating slope inclined with respect to the locking arm is formed on the locking arm. A latch laterally protrudes from the locking arm, and the latch protrudes out of an outer surface of the tray. The slider is movable to push the actuating slope, so that the locking arm is bent, and the latch retracts into the tray.

In the chassis self-unlock mechanism of the present invention, a slide groove is formed on the fixed base, and the slider is received in the slide groove and is movable along the slide groove. The actuating slope is received in the slide groove. A blocker is disposed on the other end of the locking arm. The actuating slope is formed on the blocker. The blocker is received in the slide groove. The slider is movable to push the actuating slope to push the blocker out of the slide groove. A pushing slope is formed on the slider. The pushing slope is in contact with the actuating slope. When the slider moves to the point that the pushing slope is separated from the actuating slope, the slider retains the blocker immobile outside of the slide groove.

In the chassis self-unlock mechanism of the present invention, a through slot is formed on the fixed base, a slidable fastener is protrudingly disposed on the slider, and the slidable fastener is inserted through the through slot to be movable along the through slot. The locking arm is attached to an inner surface of the tray, the tray includes a through hole, and the latch is inserted through the through hole to protrude out of the outer surface of the tray. The fixed base is disposed on the outer surface of the tray.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Figure 1:
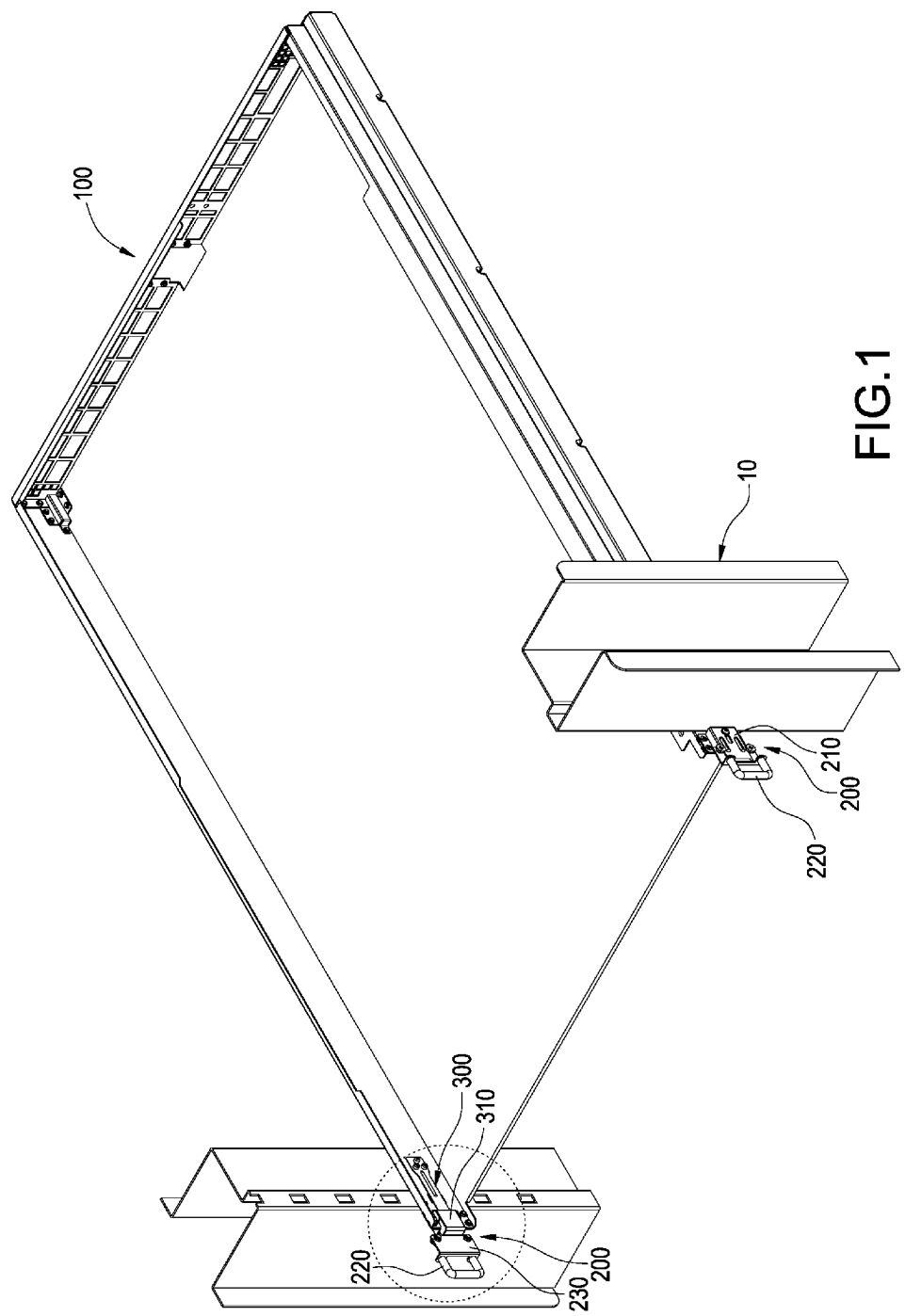
FIG. 1 is a schematic view showing a chassis self-unlock mechanism according to a preferable embodiment of the present invention.
Figure 2:
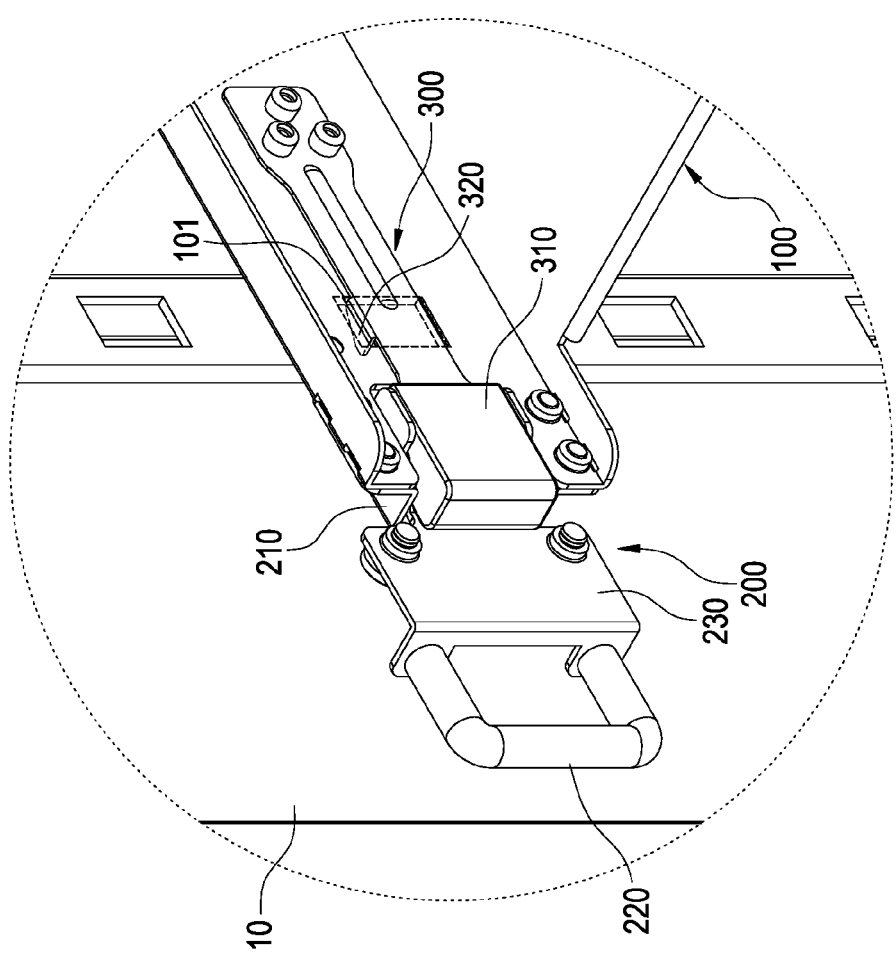
FIG. 2 is a partial enlarged view of FIG. 1.
Figure 3:
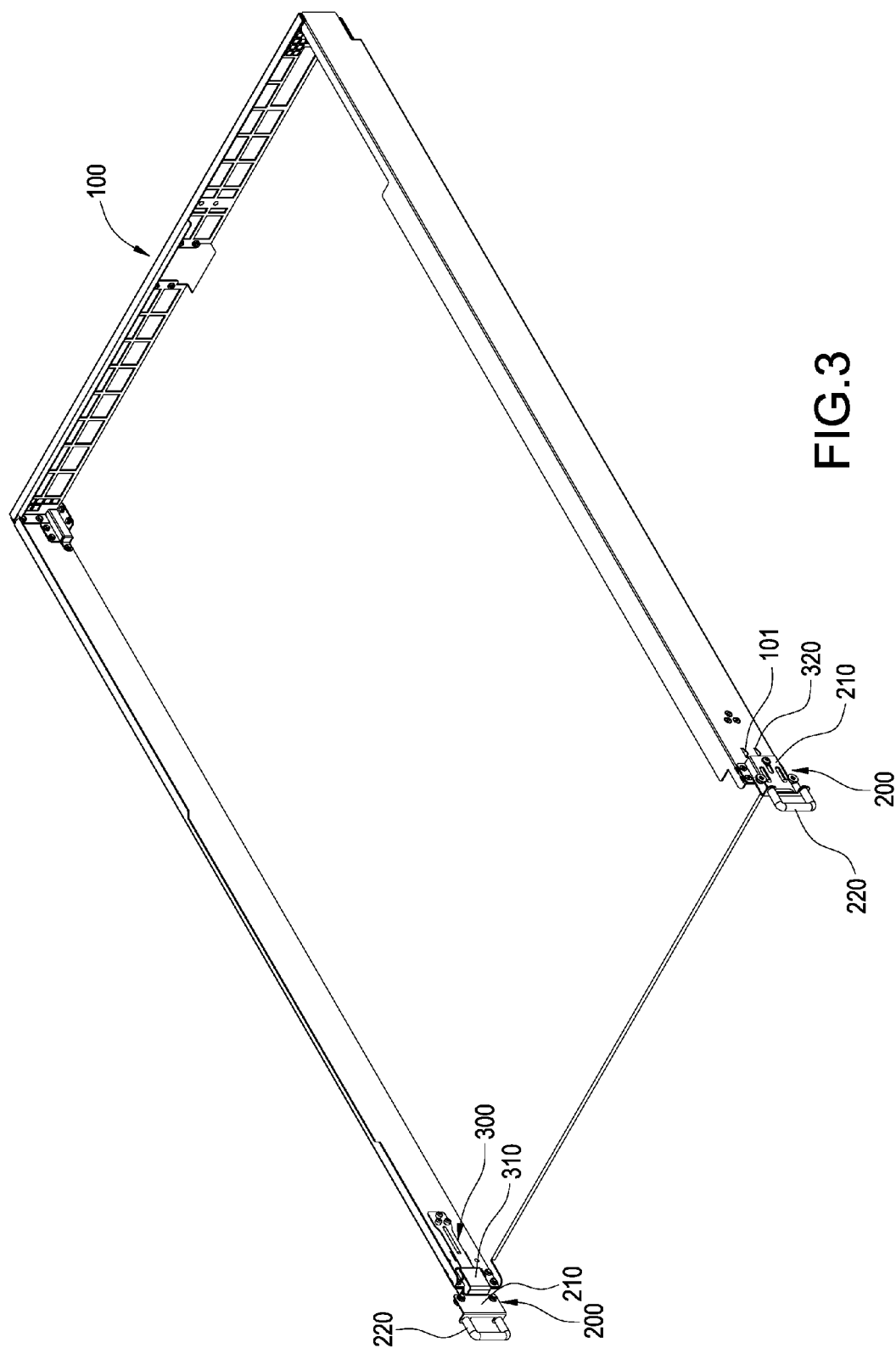
FIG. 3 is a perspective view showing the chassis self-unlock mechanism according to the preferable embodiment of the present invention.
Figure 4:
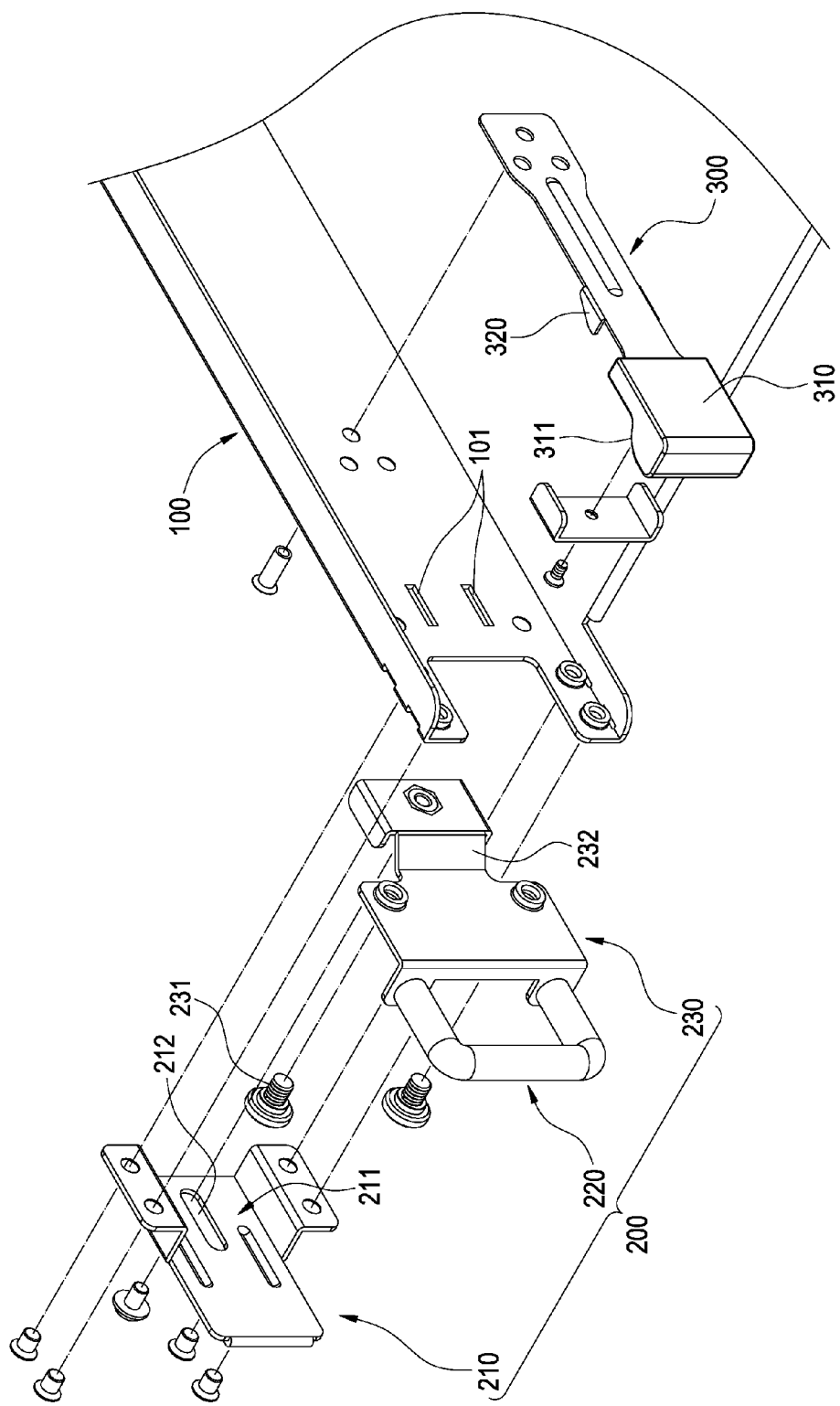
FIG. 4 is a perspective exploded view showing the chassis self-unlock mechanism according to the preferable embodiment of the present invention.
Figure 5:
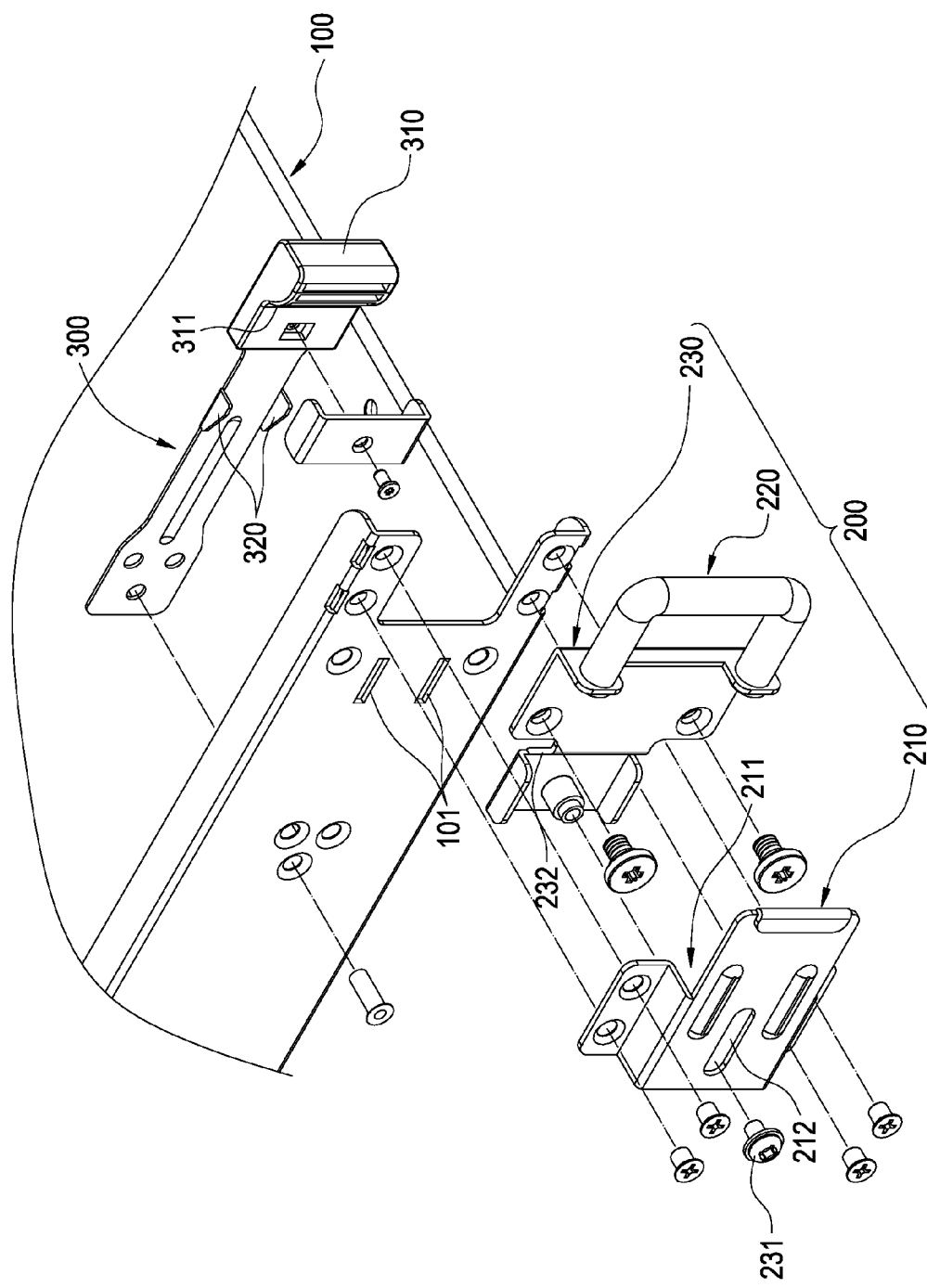
FIG. 5 is another perspective exploded view showing the chassis self-unlock mechanism according to the preferable embodiment of the present invention.
Figure 6:
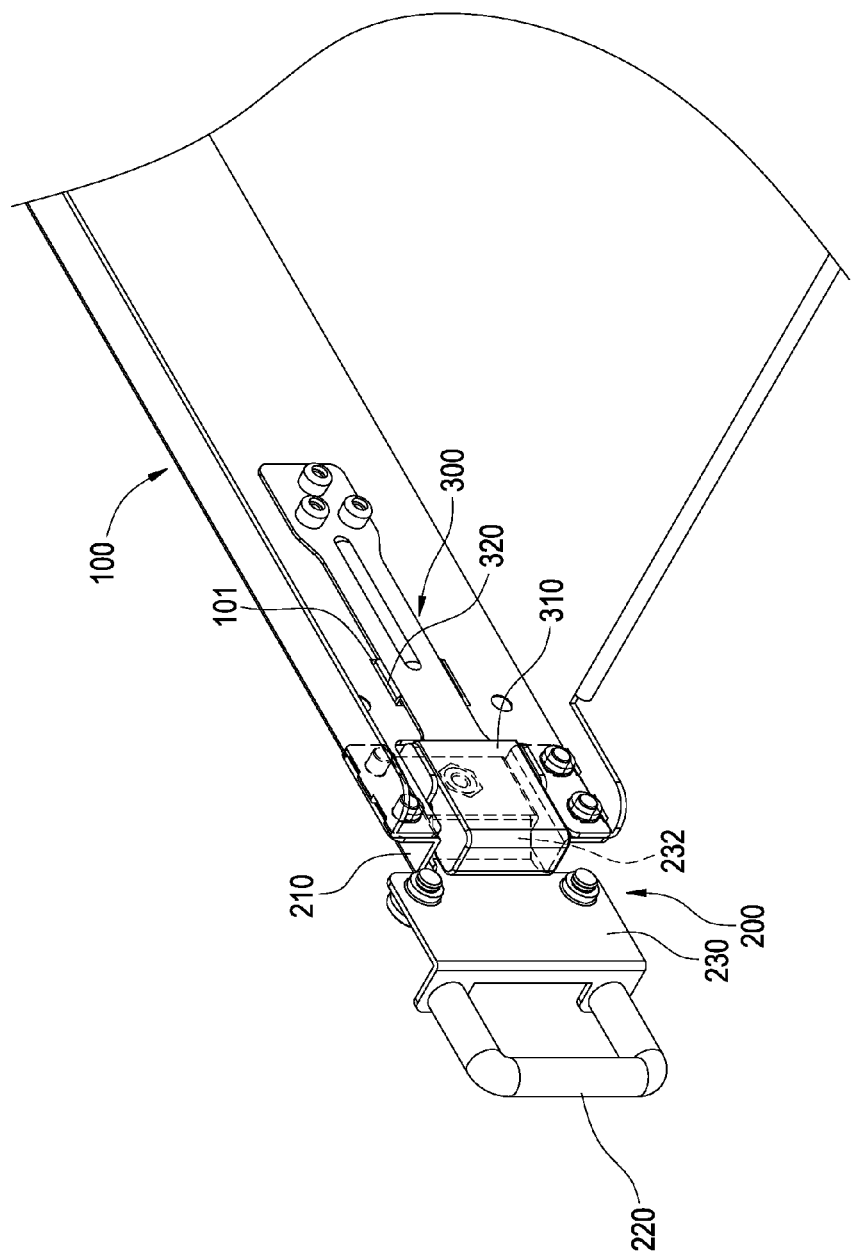
FIG. 6 is a perspective view showing the chassis self-unlock mechanism according to the preferable embodiment of the present invention.
Figure 7:
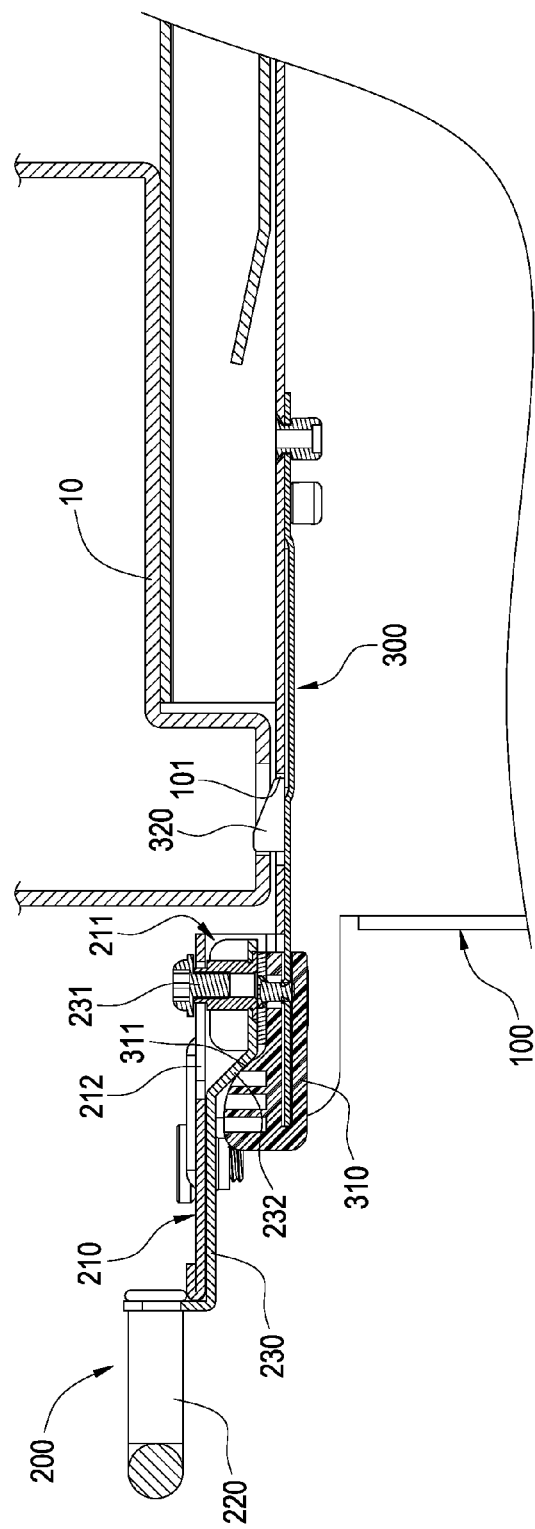
FIG. 7 is a cross-sectional view showing the chassis self-unlock mechanism in a locked state according to the preferable embodiment of the present invention.

Referring to FIG. 1, a chassis self-unlock mechanism is provided according to a preferable embodiment of the present invention, comprising a tray 100, a handle assembly 200, and a locking arm 300.

Referring to FIGS. 1 to 7, in the present embodiment, the tray 100 is preferably a rectangular drawer made of metal, and the tray 100 includes at least one through hole 101. The tray 100 is disposed in a server cabinet 10 or in a chassis 10 for receiving server hosts or hard disks.

Referring to FIG. 2 and FIGS. 4 to 7, the handle assembly 200 is disposed on the tray 100, and thereby an operator can hold the handle assembly 200 easily to pull the tray 100 out of the server cabinet 10 or the chassis 10 for maintenance. In the present embodiment, the handle assembly 200 preferably includes a fixed base 210, a handle 220 and a slider 230. The fixed base 210 is fixed on an outer surface of the tray 100. A slide groove 211 is formed in the fixed base 210, and the fixed base 210 includes at least one through slot 212 in communication with the slide groove 211. The handle 220 is connected to the slider 230, the slider 230 is received in the slide groove 211 and is movable along the slide groove 211, and thereby the slider 230 is movably connected to the fixed base 210. The slider 230 has a slide fastener 231 protrudingly disposed thereon and arranged corresponding to the through slot 212. The slide fastener 231 is inserted through the corresponding through slot 212 to be movable along the through slot 212. Furthermore, a pushing slope 232 is formed on the slider 230. The handle 220 is disposed outside the fixed base 210.

The locking arm 300 is attached to an inner surface of the tray 100. One end of the locking arm 300 is fixed to the tray 100, and the other end of the locking arm 300 is disposed with a blocker 310. The actuating slope 311 is formed on the blocker 310, and the actuating slope 311 is inclined with respect to the locking arm 300. The blocker 310 is received in the slide groove 211 in such a manner that the actuating slope 311 is disposed inside the slide groove 211 and is in contact with the pushing slope 232 of the slider 230. A middle section of the locking arm 300 has at least one latch 320 laterally and correspondingly protruding out of the through hole 101 on the tray 100. The latch 320 is correspondingly inserted through the through hole 101 to protrude out of an outer surface of the tray 100. The latch 320 is engaged with a server cabinet 10, a chassis 10, or a slide rail connected between the tray 100 and the cabinet/chassis 10, so as to lock the tray 100 in the server cabinet 10 or chassis 10.

Figure 8:
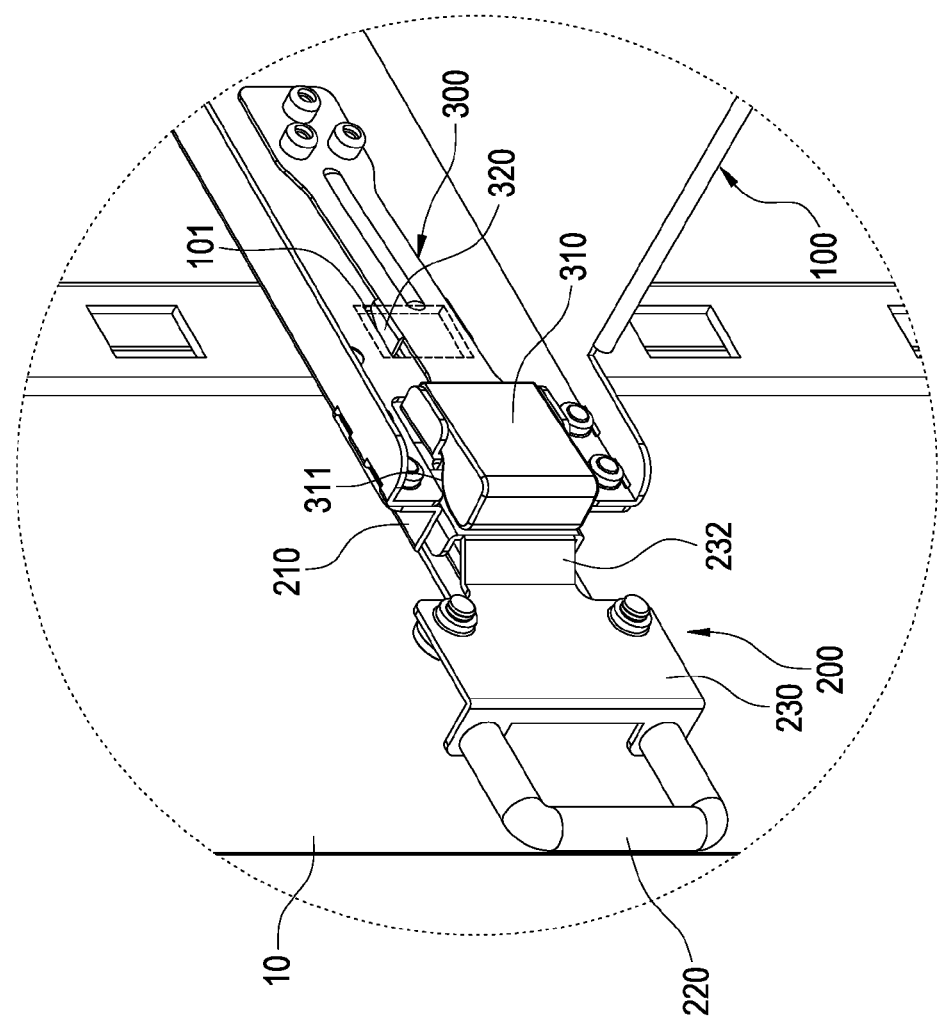
FIG. 8 is a perspective view showing the chassis self-unlock mechanism in use according to the preferable embodiment of the present invention.
Figure 9:
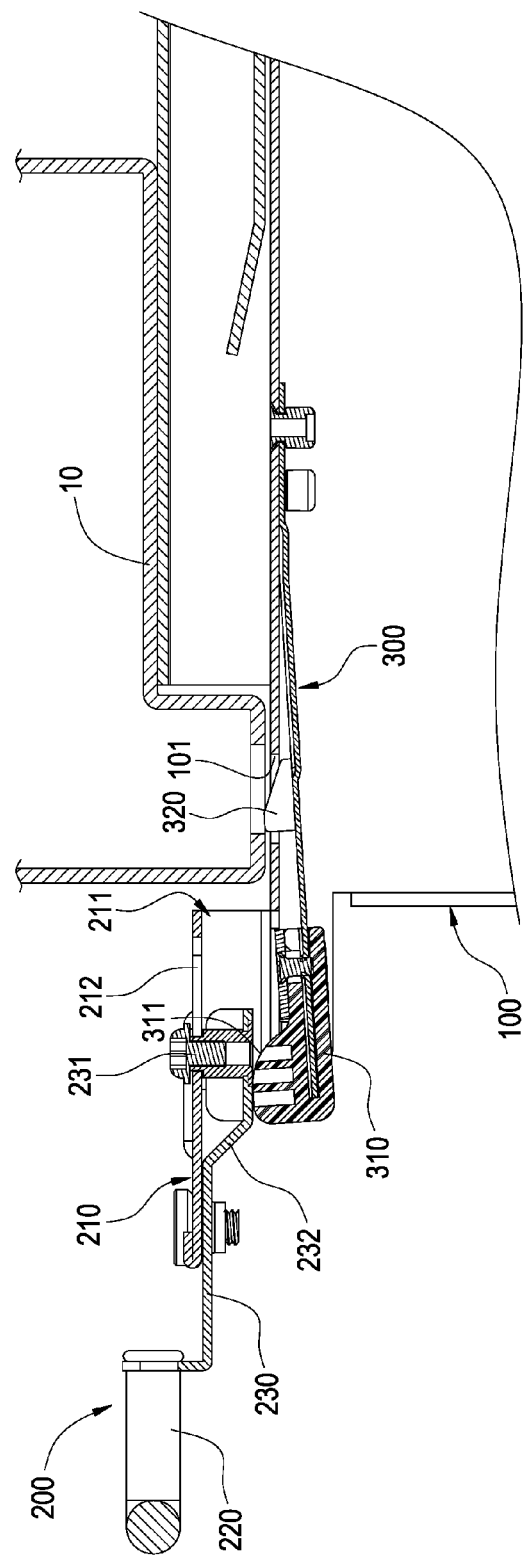
FIG. 9 is a cross-sectional view showing the chassis self-unlock mechanism in use according to the preferable embodiment of the present invention.

Referring to FIGS. 8 and 9, when the operator pulls the handle 220 to move, the slider 230 is movable to push the actuating slope 311 so as to push the blocker 310 out of the slide groove 211, and thus the locking arm 300 is bent to retract the latch 320 into the tray 100, so that the tray 100 can be released from the server cabinet 10 or the chassis 10. Moreover, when the slider 230 is movable to the point that the pushing slope 232 is separated from the actuating slope 311, the slider 230 retains the blocker 310 immobile outside the slide groove 211, and thereby the latch 320 is fixed inside the tray 100. As a result, the operator can continues to pull the handle 220 to pull the tray 100 out of the server cabinet 10 or the chassis 10.

After pushing the tray 100 back into the server cabinet 10 or chassis 10, the operator pushes the handle 220 inwardly toward the server cabinet 10 or the chassis 10 to separate the slider 230 from the blocker 310, and the blocker 310 is pushed back into the slide groove 211 by a restoring elastic force of the locking arm 300. At the same time, the latch 320 is engaged with the server cabinet 10, the chassis 10 or the slide rail connected between the tray 100 and the server cabinet/chassis 10, so as to lock the tray 100 inside the server cabinet 10 or the chassis 10.

Figure 10:
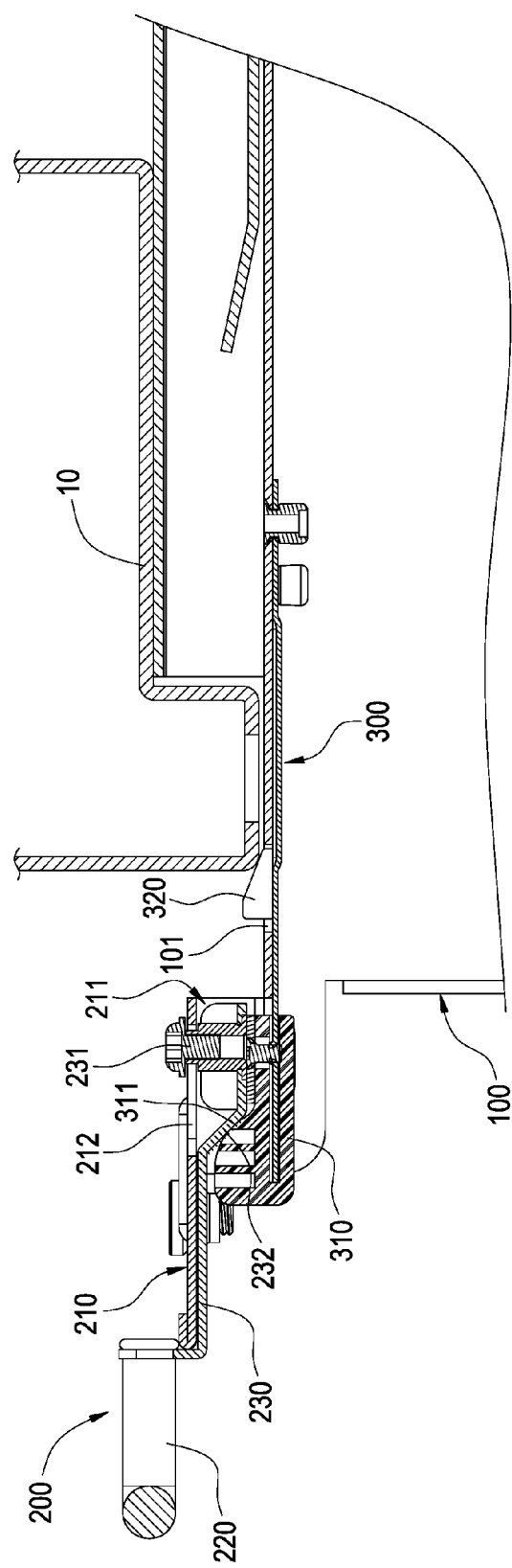
FIG. 10 is another cross-sectional view showing the chassis self-unlock mechanism in use according to the preferable embodiment of the present invention.

Referring to FIG. 10, the operator can also directly hold the handle 220 to push the tray 100 back into the server cabinet 10 or the chassis 10. When the operator pushes the handle 220 inwardly toward the server cabinet 10 or the chassis 10, the slider 230 is separated from the blocker 310, the blocker 310 is pushed back into the slide groove 211 by the restoring elastic force of the locking arm 300, and at the same time the latch 320 protrudes out of the tray 100. When the operator continues to push the tray 100 back into the server cabinet 10 or the chassis 10 to the point that the latch 320 contacts the server cabinet 10 or the chassis 10, the latch 320 is pressed into the tray 100 by the server cabinet 10 or the chassis 10. Then, when the latch 320 moves to a position on the server cabinet 10 or the chassis 10 for corresponding engagement therewith, the locking arm 300 recoils, and the latch 320 is engaged with the server cabinet 10 or the chassis 10 or the slide rail connected between the tray 100 and the server cabinet/chassis 10, so that the tray 100 is locked inside the server cabinet/chassis 10.

The operator only needs to hold the handle 220 to directly pull the tray 100 outwardly, and then the tray 100 can be unlocked and released at the same time by means of the chassis self-unlock mechanism of the present invention.

Compared with the conventional techniques, the tray 100 is easy to operate by means of the chassis self-unlock mechanism of the present invention.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. A chassis self-unlock mechanism, comprising:
   a tray;
   a handle assembly, the handle assembly including a fixed base, a handle and a slider connected to the handle, the fixed base being fixed on the tray, the slider being movably connected with the fixed base; and
   a locking arm, the locking arm being attached to the tray, an end of the locking arm being fixed to the tray, an actuating slope inclined with respect to the locking arm being formed on the locking arm, a latch laterally protruding from the locking arm, the latch protruding out of an outer surface of the tray, wherein the slider is movable to push the actuating slope, so that the locking arm is bent, and the latch retracts into the tray,
   wherein a slide groove is formed on the fixed base, and the slider is received in the slide groove and is movable along the slide groove;
   wherein the actuating slope is received in the slide groove.

2. A chassis self-unlock mechanism, comprising:
   a tray;
   a handle assembly, the handle assembly including a fixed base, a handle and a slider connected to the handle, the fixed base being fixed on the tray, the slider being movably connected with the fixed base; and
   a locking arm, the locking arm being attached to the tray, an end of the locking arm being fixed to the tray, an actuating slope inclined with respect to the locking arm being formed on the locking arm, a latch laterally protruding from the locking arm, the latch protruding out of an outer surface of the tray, wherein the slider is movable to push the actuating slope, so that the locking arm is bent, and the latch retracts into the tray,
   wherein a slide groove is formed on the fixed base, and the slider is received in the slide groove and is movable along the slide groove;
   wherein a blocker is disposed on the other end of the locking arm, the actuating slope is formed on the blocker, and the blocker is received in the slide groove.

3. The chassis self-unlock mechanism of claim 2, wherein the slider is movable to push the actuating slope so as to push the blocker out of the slide groove.

4. The chassis self-unlock mechanism of claim 3, wherein a pushing slope is formed on the slider, and the pushing slope is in contact with the actuating slope.

5. The chassis self-unlock mechanism of claim 4, wherein when the slider moves to the point that the pushing slope is separated from the actuating slope, the slider retains the blocker immobile outside the slide groove.

6. A chassis self-unlock mechanism, comprising:
   a tray;
   a handle assembly, the handle assembly including a fixed base, a handle and a slider connected to the handle, the fixed base being fixed on the tray, the slider being movably connected with the fixed base; and
   a locking arm, the locking arm being attached to the tray, an end of the locking arm being fixed to the tray, an actuating slope inclined with respect to the locking arm being formed on the locking arm, a latch laterally protruding from the locking arm, the latch protruding out of an outer surface of the tray, wherein the slider is movable to push the actuating slope, so that the locking arm is bent, and the latch retracts into the tray, wherein a through slot is formed on the fixed base, a slidable fastener is protrudingly disposed on the slider, and the slidable fastener is inserted through the through slot to be movable along the through slot.

7. The chassis self-unlock mechanism of claim 1, wherein the locking arm is attached to an inner surface of the tray, the tray includes a through hole, and the latch is inserted through the through hole to protrude out of the outer surface of the tray.

8. A chassis self-unlock mechanism, comprising:

a tray;

a handle assembly, the handle assembly including a fixed base, a handle and a slider connected to the handle, the fixed base being fixed on the tray, the slider being movably connected with the fixed base; and a locking arm, the locking arm being attached to the tray, an end of the locking arm being fixed to the tray, an actuating slope inclined with respect to the locking arm being formed on the locking arm, a latch laterally protruding from the locking arm, the latch protruding out of an outer surface of the tray, wherein the slider is movable to push the actuating slope, so that the locking arm is bent, and the latch retracts into the tray, wherein the fixed base is disposed on the outer surface of the tray.

* * * * *